US010886669B2

(12) United States Patent
Takahashi

(10) Patent No.: US 10,886,669 B2
(45) Date of Patent: Jan. 5, 2021

(54) ELECTRICAL CONNECTOR MOUNTED ON A SUBSTRATE WITH SHIELD STRUCTURES AROUND THE TERMINALS AND AN INSULATIVE HOUSING

(71) Applicant: Yazaki Corporation, Tokyo (JP)

(72) Inventor: Takakazu Takahashi, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 16/537,462

(22) Filed: Aug. 9, 2019

(65) Prior Publication Data
US 2020/0091661 A1 Mar. 19, 2020

(30) Foreign Application Priority Data
Sep. 13, 2018 (JP) .................. 2018-171318

(51) Int. Cl.
*H01R 13/6594* (2011.01)
*H01R 12/57* (2011.01)
(Continued)

(52) U.S. Cl.
CPC ......... *H01R 13/6594* (2013.01); *H01R 12/57* (2013.01); *H01R 12/716* (2013.01);
(Continued)

(58) Field of Classification Search
CPC ............ H01R 13/6581; H01R 13/6594; H01R 13/6658; H01R 12/724; H01R 13/6593; H01R 13/502; H01R 13/648; H01R 13/6466; H01R 13/6469; H01R 13/6587; H01R 12/71; H01R 24/50; H01R 13/516;
(Continued)

(56) References Cited

U.S. PATENT DOCUMENTS 5,035,650 A 7/1991 Defibaugh et al.
10,505,318 B2 * 12/2019 Zhao ...................... H01R 4/029
(Continued)

FOREIGN PATENT DOCUMENTS

| CN | 103081251 A | 5/2013 |
| CN | 106486814 A | 3/2017 |
| JP | 2012-22885 A | 2/2012 |

*Primary Examiner* — Abdullah A Riyami
*Assistant Examiner* — Justin M Kratt
(74) *Attorney, Agent, or Firm* — Kenealy Vaidya LLP

(57) ABSTRACT

A substrate connector includes an insulative housing fixed onto a substrate, a first terminal electrically connected to a first communication line of a communication cable in the inside of the housing and electrically connected to a circuit of the substrate on the outside of the housing, and a second terminal electrically connected to a second communication line of the communication cable in the inside of the housing and electrically connected to the circuit of the substrate on the outside of the housing. The housing includes a main body that is fixed onto the substrate, a terminal-retaining portion arranged in the inside of the main body, integrally formed with the housing, and retains the first and second terminals, and a shell-retaining portion including slit portions formed between the main body and the terminal-retaining portion and to which a shield shell surrounding the first and second terminals is inserted.

16 Claims, 15 Drawing Sheets

(51) Int. Cl.
*H01R 12/71* (2011.01)
*H01R 13/42* (2006.01)
*H01R 12/72* (2011.01)
*H05K 1/11* (2006.01)
H01R 13/6593 (2011.01)
H01R 13/502 (2006.01)
H01R 13/6469 (2011.01)
H01R 13/6581 (2011.01)
H01R 13/66 (2006.01)
H01R 13/6587 (2011.01)
H01R 13/40 (2006.01)
H01R 13/648 (2006.01)
H01R 24/50 (2011.01)
H01R 13/516 (2006.01)
H01R 13/6466 (2011.01)

(52) U.S. Cl.
CPC ......... *H01R 12/721* (2013.01); *H01R 12/722* (2013.01); *H01R 13/42* (2013.01); *H05K 1/11* (2013.01); *H01R 12/71* (2013.01); *H01R 12/724* (2013.01); *H01R 13/40* (2013.01); *H01R 13/502* (2013.01); *H01R 13/516* (2013.01); *H01R 13/648* (2013.01); *H01R 13/6466* (2013.01); *H01R 13/6469* (2013.01); *H01R 13/6581* (2013.01); *H01R 13/6587* (2013.01); *H01R 13/6593* (2013.01); *H01R 13/6658* (2013.01); *H01R 24/50* (2013.01)

(58) Field of Classification Search
CPC .. H01R 12/716; H01R 12/722; H01R 12/721; H01R 13/40
USPC ............ 439/607.11, 607.01, 607.13, 607.27, 439/607.28, 607.35, 607.36, 607.55
See application file for complete search history.

(56) References Cited

U.S. PATENT DOCUMENTS

| | | | |
|---|---|---|---|
| 2009/0253298 A1* | 10/2009 | Kameyama | H01R 12/724 439/607.41 |
| 2009/0318025 A1* | 12/2009 | Kameyama | H01R 13/648 439/607.09 |
| 2013/0149902 A1 | 6/2013 | Tsuchiya | |
| 2018/0076579 A1* | 3/2018 | Tokita | H01R 13/5804 |
| 2019/0067882 A1* | 2/2019 | Kumamoto | H01R 13/518 |

* cited by examiner

ELECTRICAL CONNECTOR MOUNTED ON A SUBSTRATE WITH SHIELD STRUCTURES AROUND THE TERMINALS AND AN INSULATIVE HOUSING

CROSS-REFERENCE TO RELATED APPLICATION(S)

The present application claims priority to and incorporates by reference the entire contents of Japanese Patent Application No. 2018-171318 filed in Japan on Sep. 13, 2018.

BACKGROUND OF THE INVENTION

1. Field of the Invention

The present invention relates to a substrate connector.

2. Description of the Related Art

Conventionally, there have been substrate connectors having a shield function. In Japanese Patent Application Laid-open No. 2012-022885, disclosed is a technique of a shield connector for substrate including an inner conductor terminal, an outer conductor terminal covering the outer periphery of the inner conductor terminal, a dielectric body arranged between the inner conductor terminal and the outer conductor terminal, and a connector housing that houses therein the outer conductor terminal and is fixed onto a plate surface of a substrate.

In a substrate connector, at least being capable of reducing the number of components, or being capable of standardizing components has been desirous. For example, if the components can be standardized regardless of the necessity of shield function, reduction in the number of items can be achieved.

SUMMARY OF THE INVENTION

An object of the present invention is to provide a substrate connector capable of reducing the number of components. Another object of the present invention is to provide a substrate connector capable of standardizing components regardless of the necessity of shield function.

A substrate connector according to one aspect of the present invention includes an insulative housing configured to be fixed onto a substrate; a first terminal configured to be electrically connected to a first communication line of a communication cable in an inside of the housing, and to be electrically connected to a circuit of the substrate on an outside of the housing; and a second terminal configured to be electrically connected to a second communication line of the communication cable in the inside of the housing, and to be electrically connected to the circuit of the substrate on the outside of the housing, wherein the housing includes a main body that is an outer wall portion of the housing and is configured to be fixed onto the substrate, a terminal-retaining portion that is arranged in an inside of the main body, is integrally formed with the main body, and retains the first terminal and the second terminal, and a shell-retaining portion that includes a slit portion formed between the main body and the terminal-retaining portion and receives a shield shell inserted thereto to surround the first terminal and the second terminal.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENT

The following describes in detail a substrate connector according to an exemplary embodiment of the present invention with reference to the accompanying drawings. The invention, however, is not intended to be limited by the embodiment. The constituent elements in the following embodiment include elements easily achieved by a person skilled in the art or elements being substantially the same as the constituent elements.

Embodiment

Figure 1:
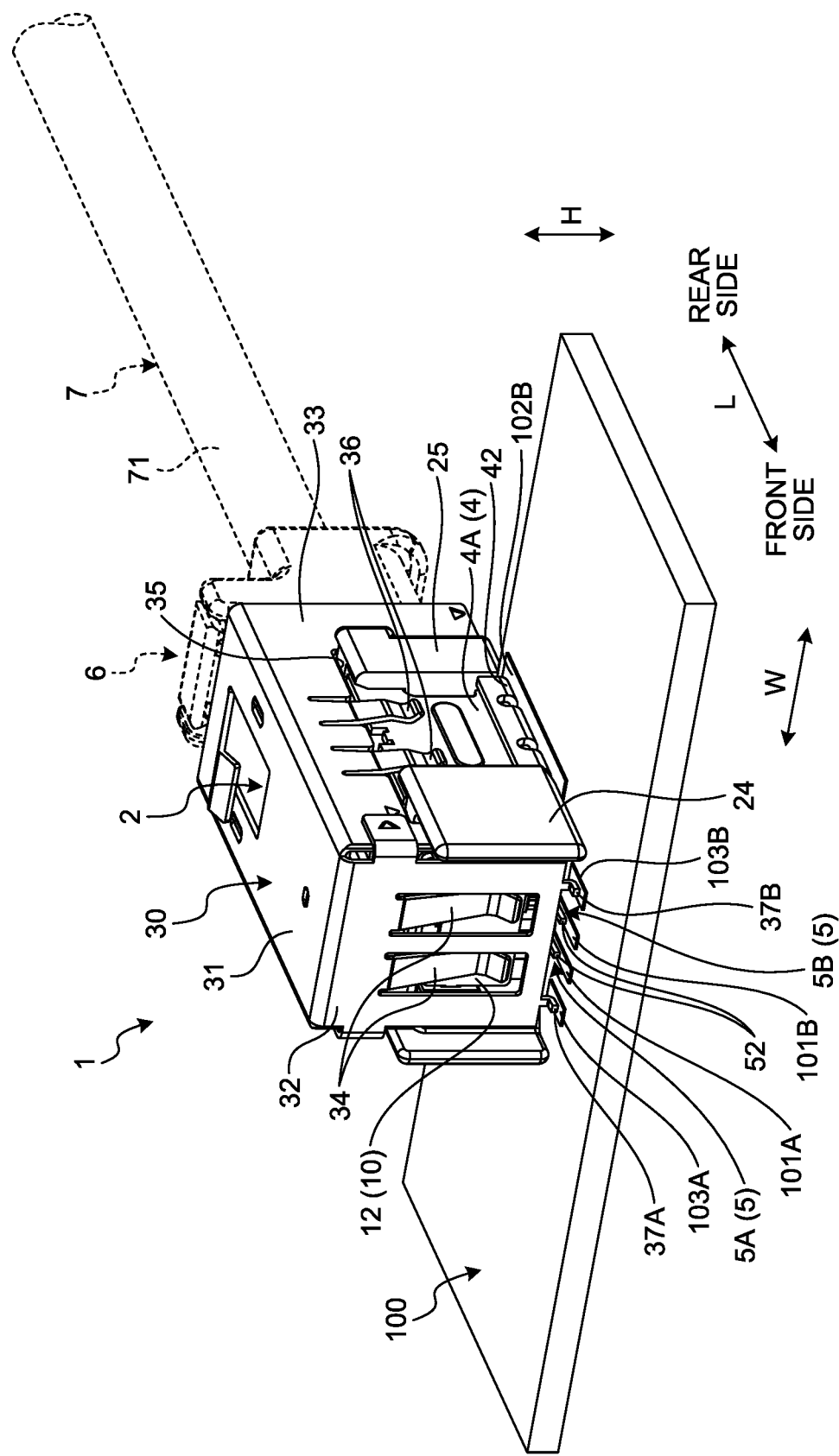
FIG. 1 is a perspective view of a substrate connector according to an embodiment.
Figure 4:
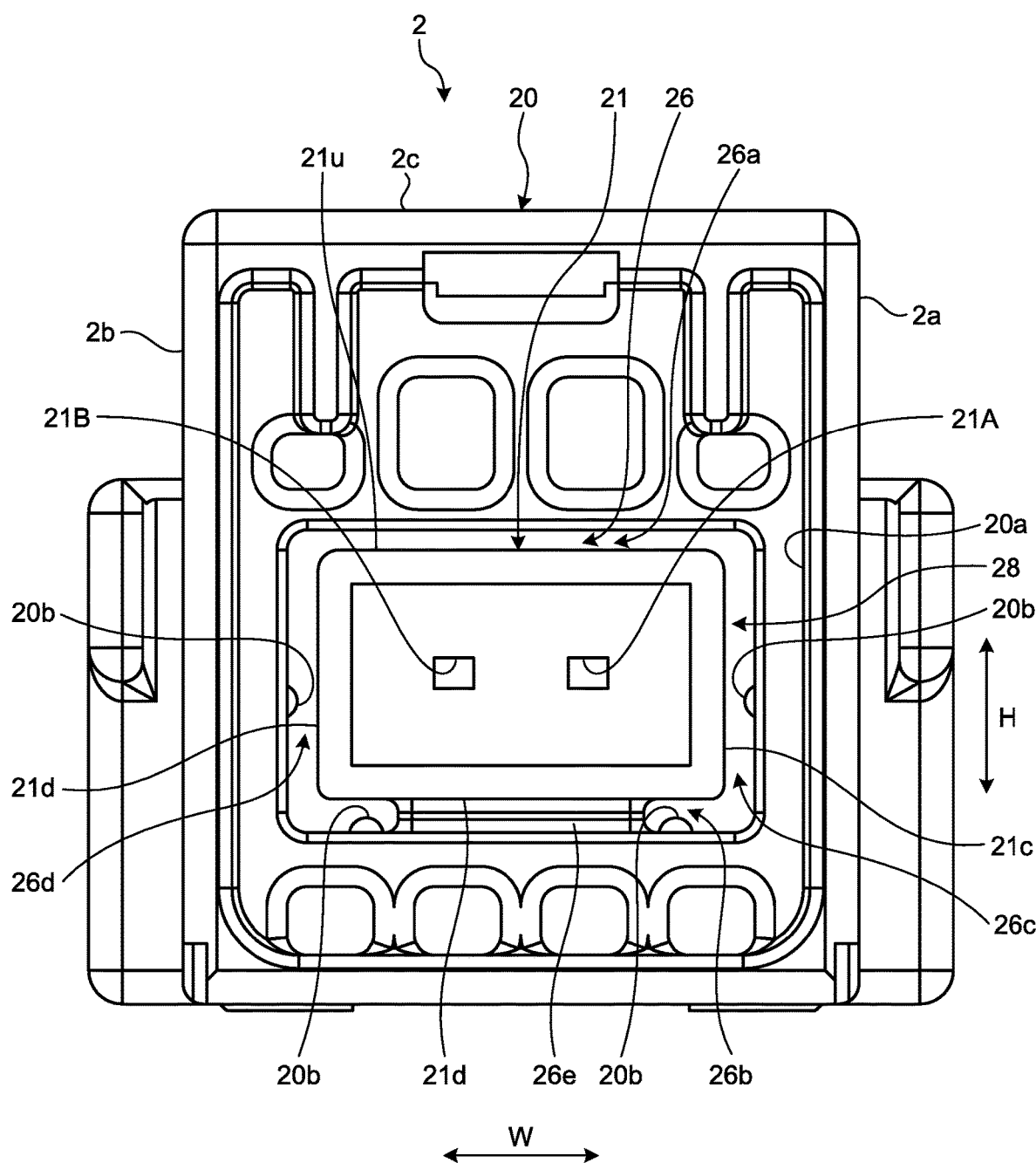
FIG. 4 is a rear view of a housing according to the embodiment.
Figure 5:
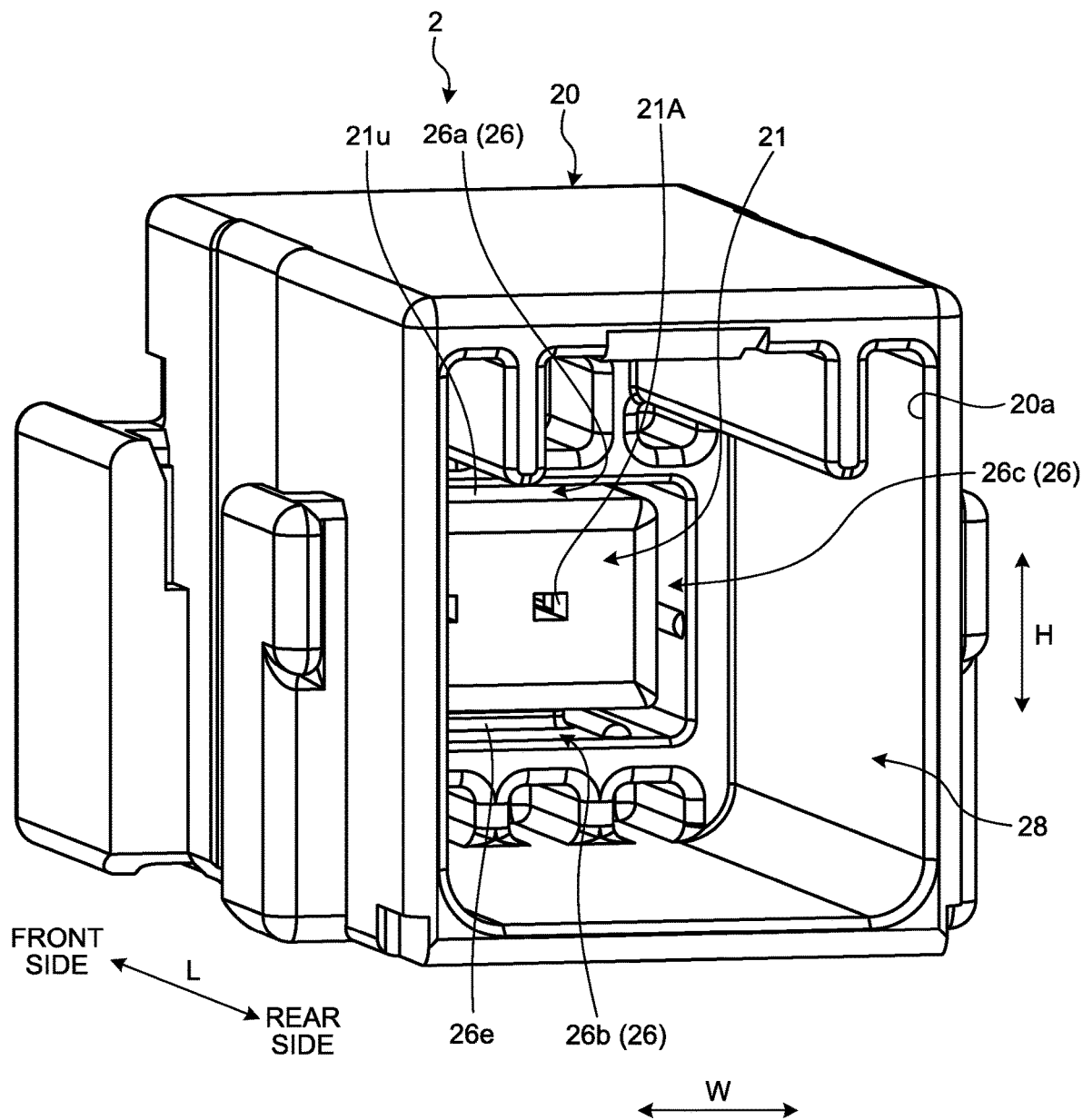
FIG. 5 is a perspective view of the housing according to the embodiment.
Figure 6:
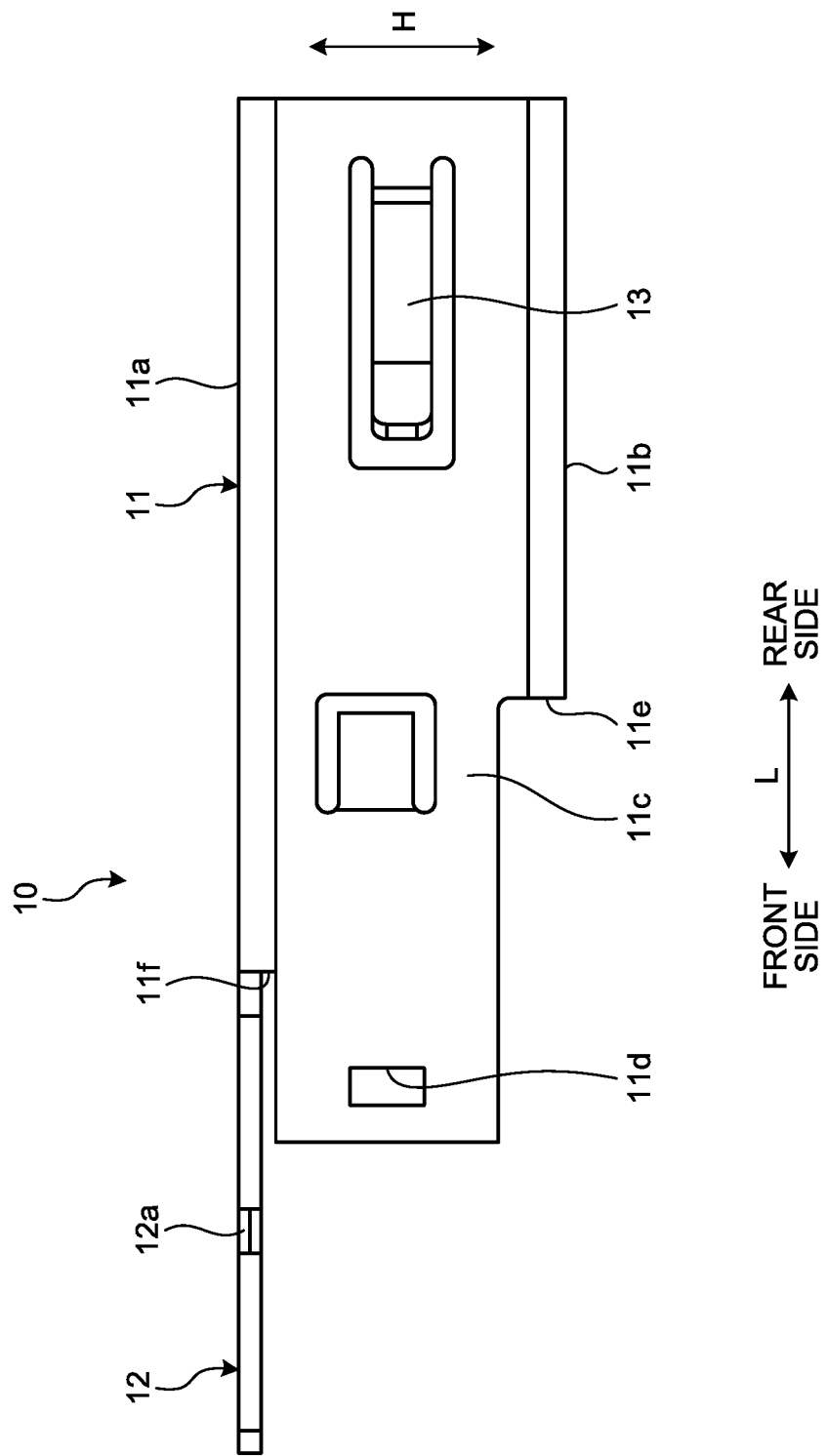
FIG. 6 is a lateral view of a shield shell according to the embodiment.
Figure 7:
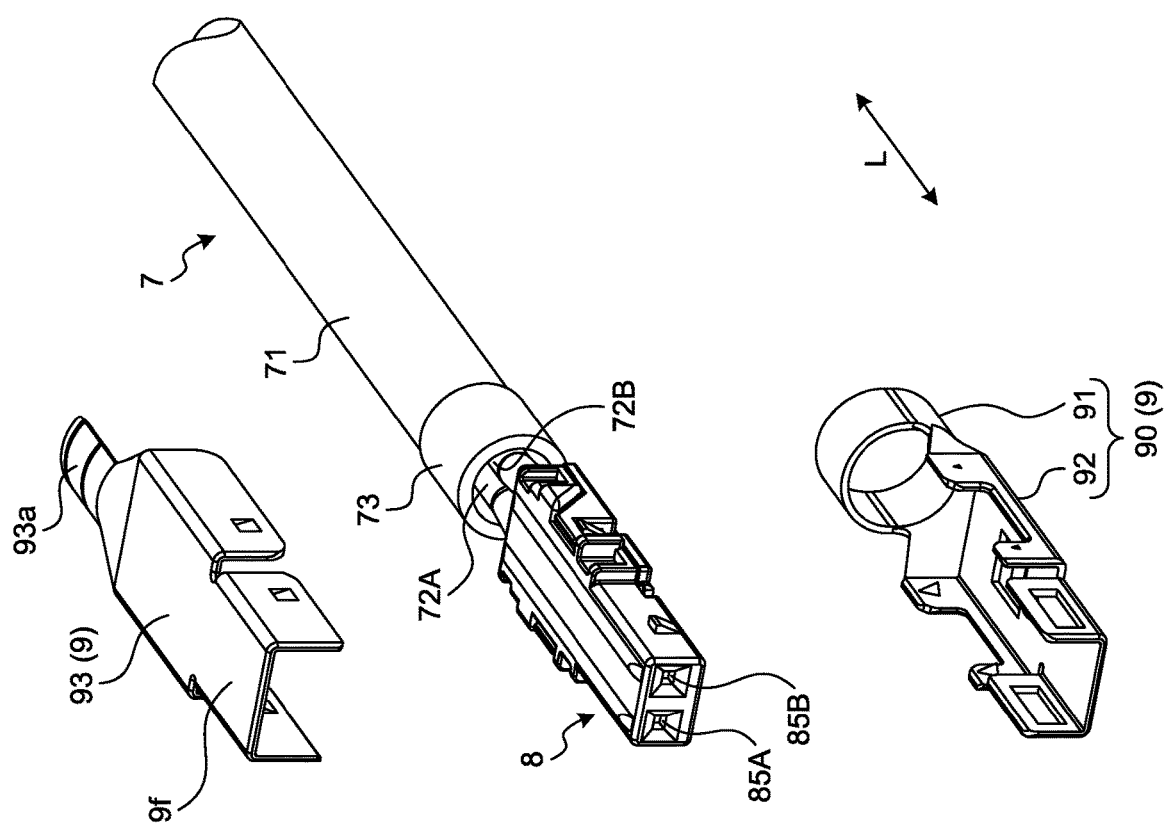
FIG. 7 is an exploded perspective view of a cable connector according to the embodiment.
Figure 8:
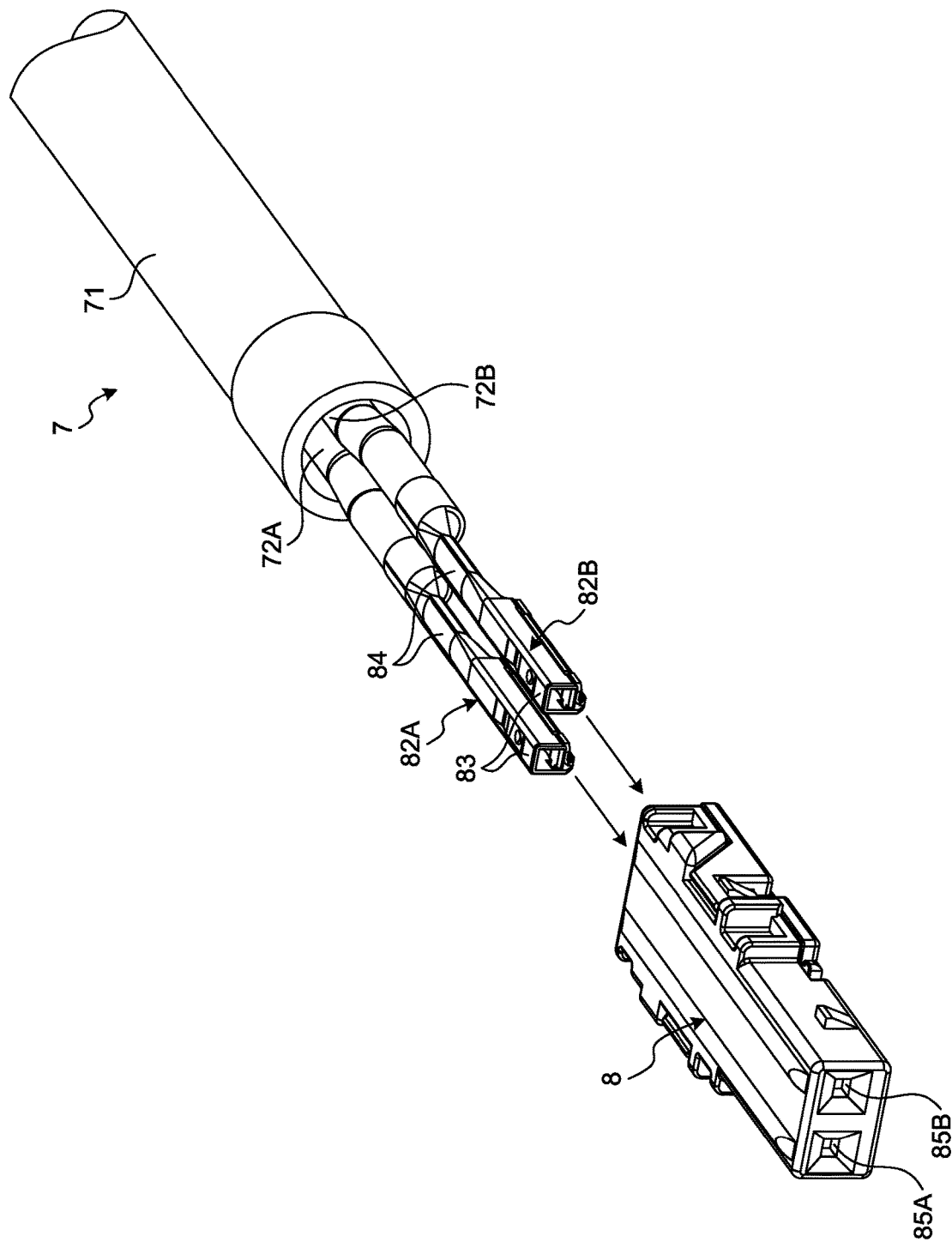
FIG. 8 is a perspective view illustrating female terminals of the cable connector according to the embodiment.
Figure 9:
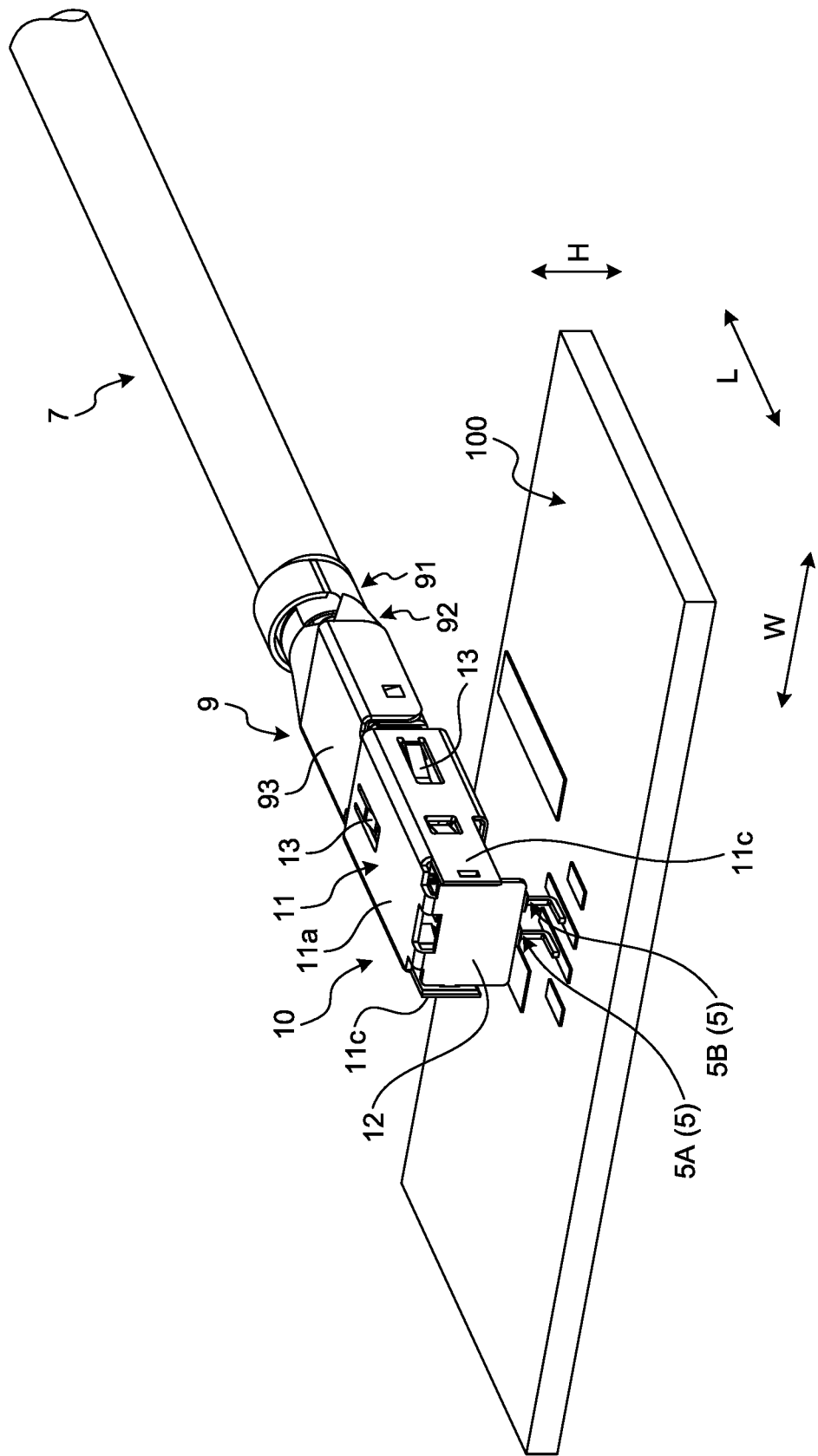
FIG. 9 is a perspective view illustrating the inside of the substrate connector according to the embodiment.

With reference to FIG. 1 to FIG. 15, an exemplary embodiment will be described. The present embodiment relates to a substrate connector. FIG. 1 is a perspective view of a substrate connector according to the embodiment, FIG. 2 is a plan view of the substrate connector according to the embodiment, FIG. 3 is an exploded perspective view of the substrate connector according to the embodiment, FIG. 4 is a rear view of a housing according to the embodiment, FIG. 5 is a perspective view of the housing according to the embodiment, FIG. 6 is a lateral view of a shield shell according to the embodiment, FIG. 7 is an exploded perspective view of a cable connector according to the embodiment, FIG. 8 is a perspective view illustrating female terminals of the cable connector according to the embodiment, and FIG. 9 is a perspective view illustrating the inside of the substrate connector according to the embodiment.

Figure 10:
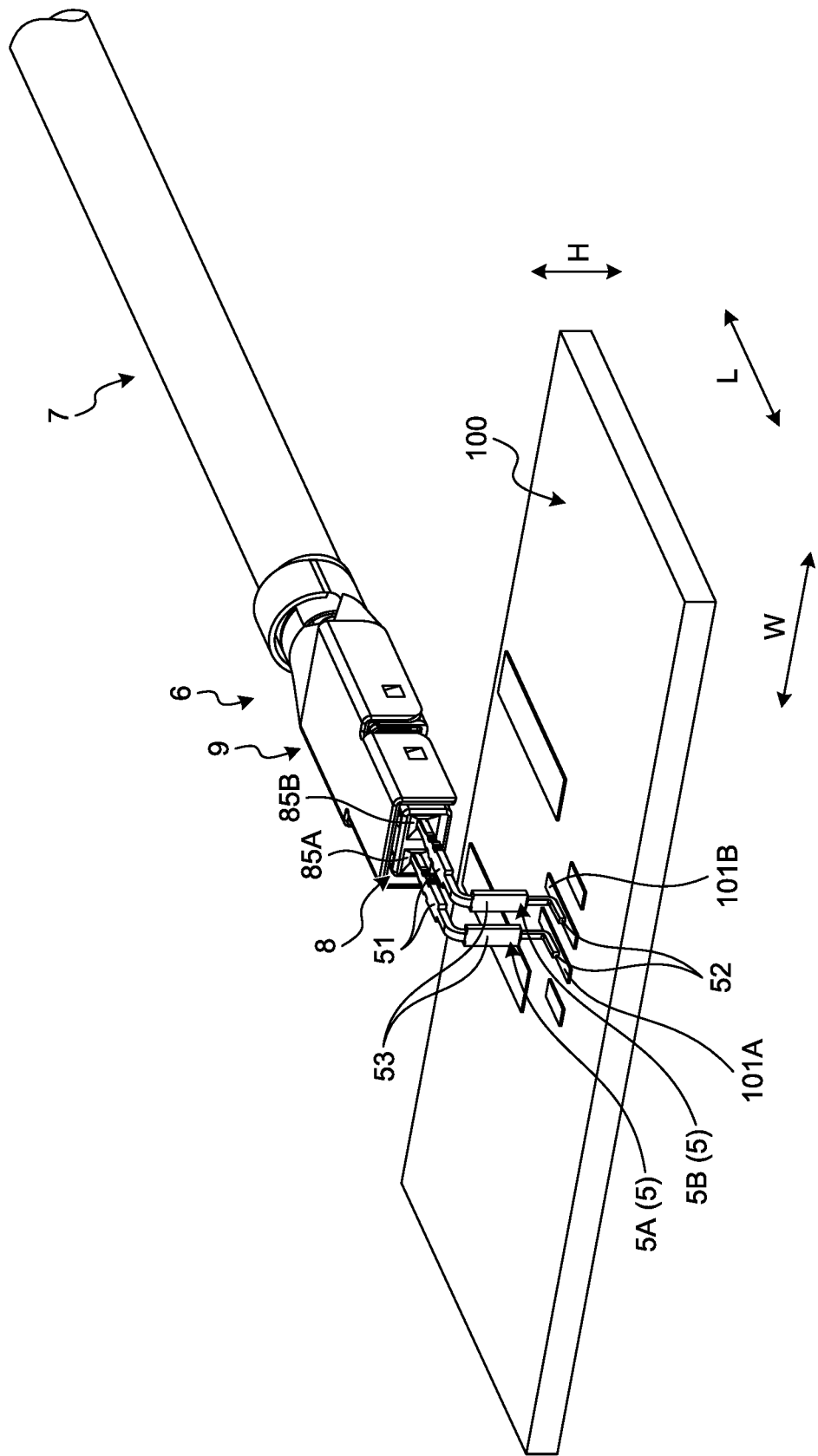
FIG. 10 is a perspective view illustrating a connection configuration in the inside of the substrate connector according to the embodiment.
Figure 11:
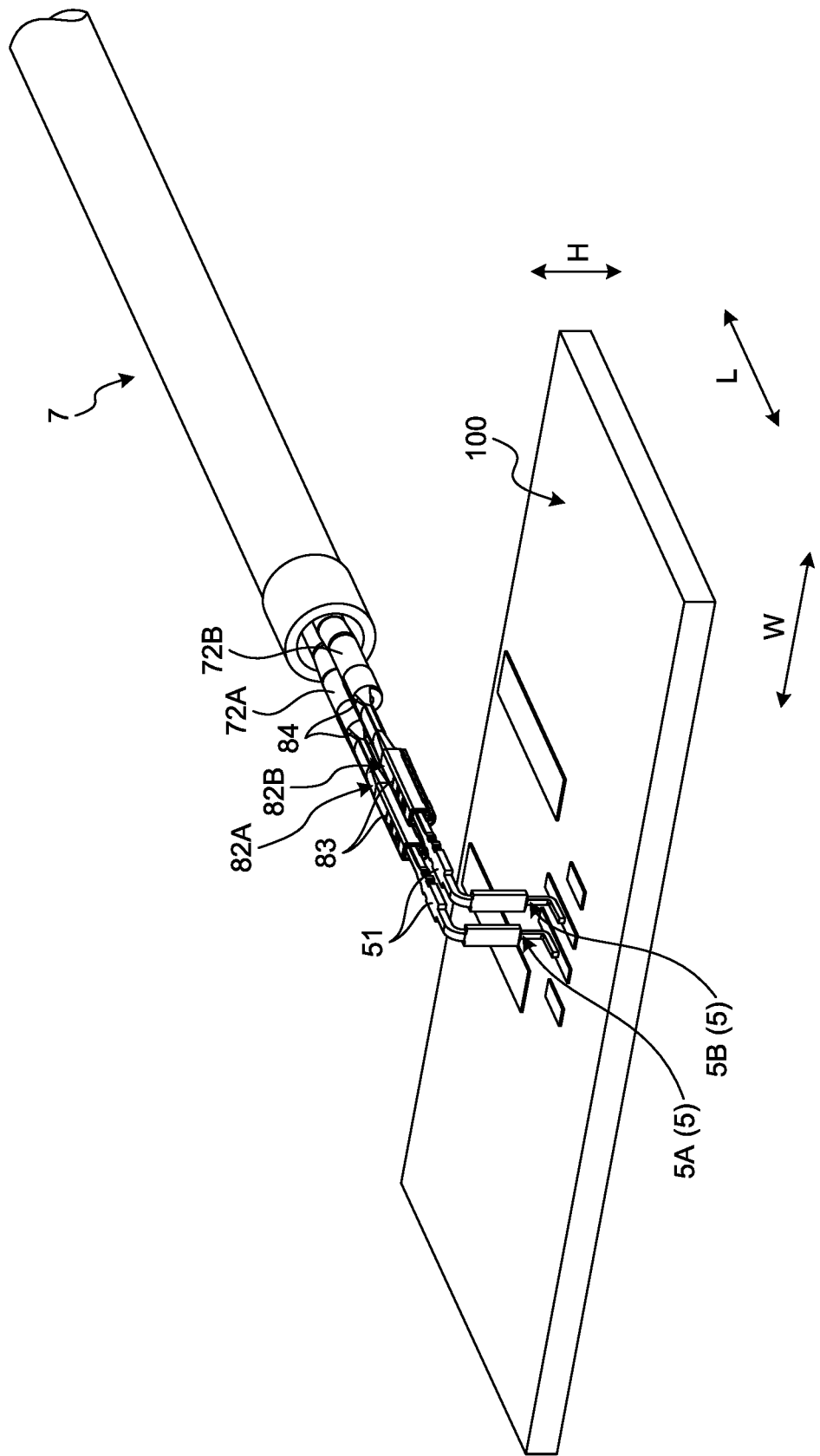
FIG. 11 is another perspective view illustrating the connection configuration in the inside of the substrate connector according to the embodiment.
Figure 12:
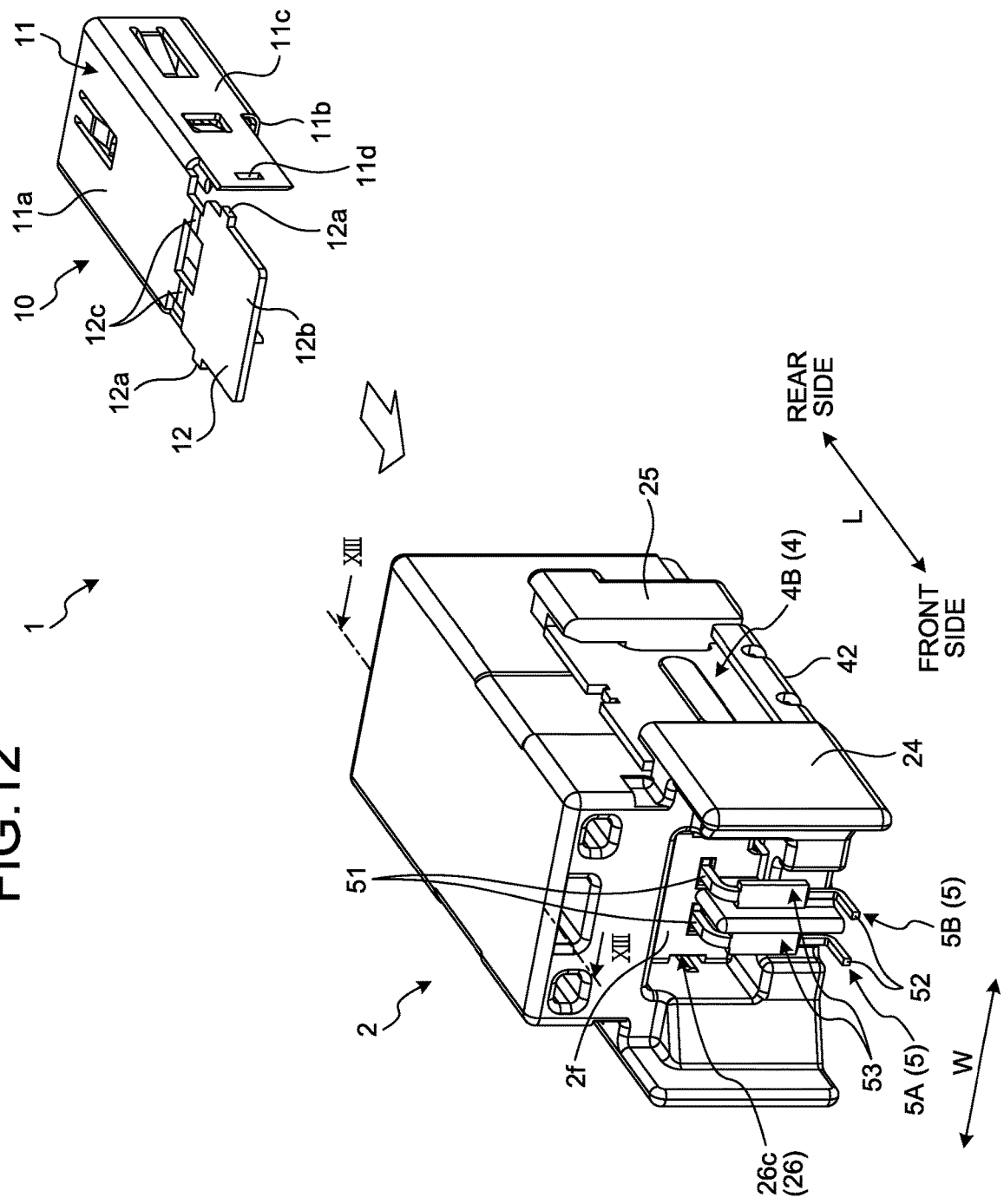
FIG. 12 is a perspective view for explaining assembling of the shield shell according to the embodiment.
Figure 13:
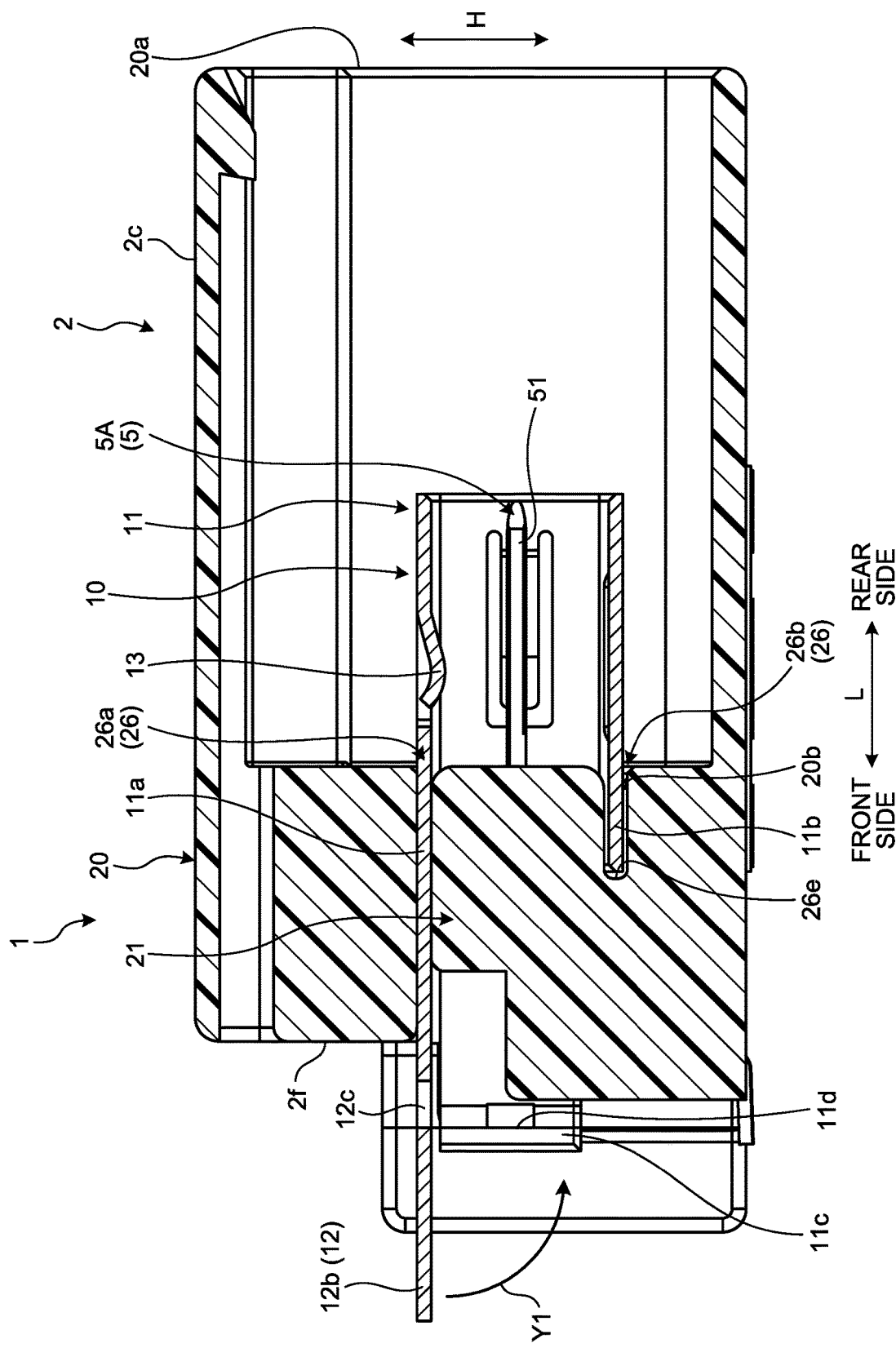
FIG. 13 is a sectional view of the substrate connector according to the embodiment.
Figure 14:
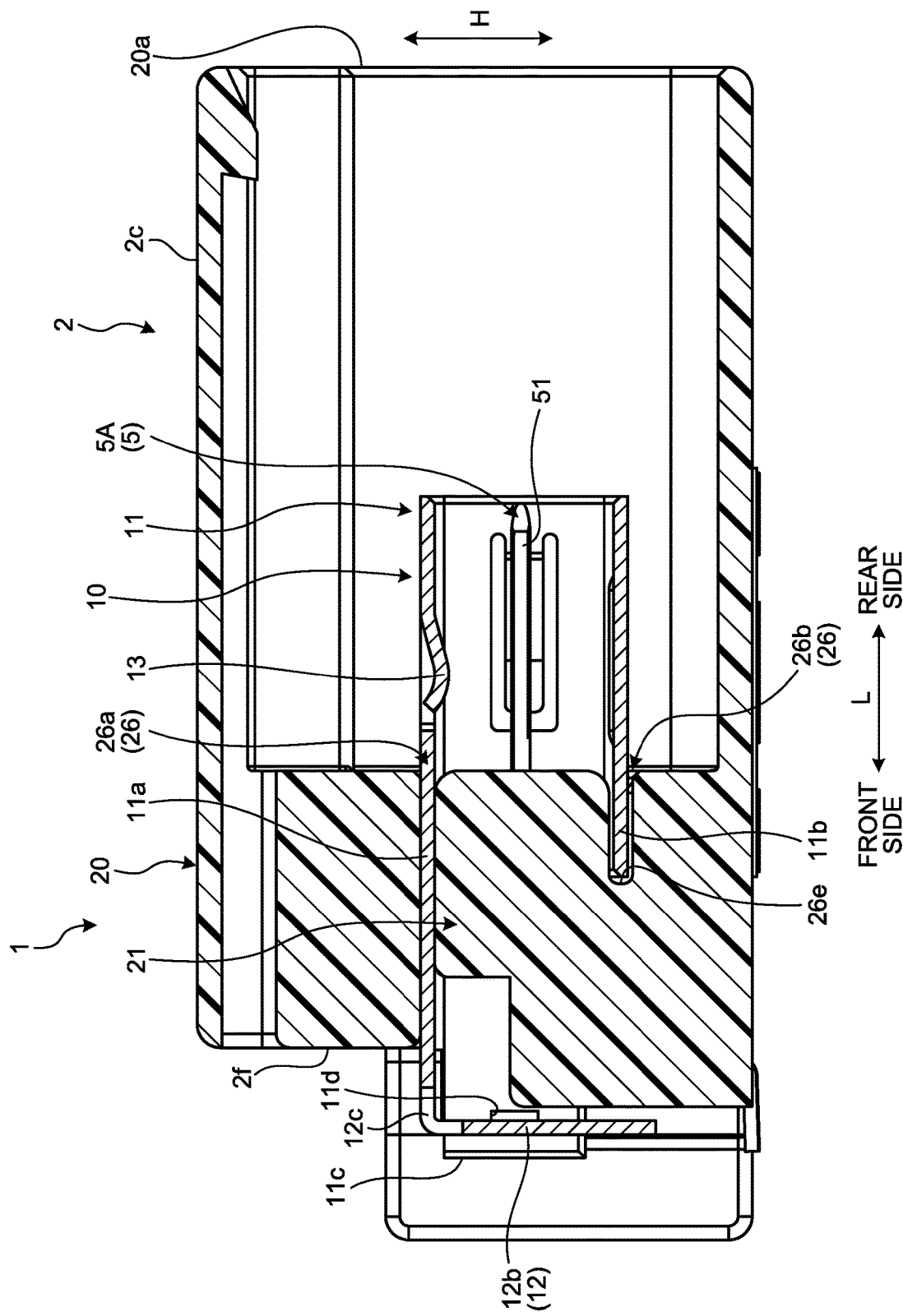
FIG. 14 is another sectional view of the substrate connector according to the embodiment.
Figure 15:
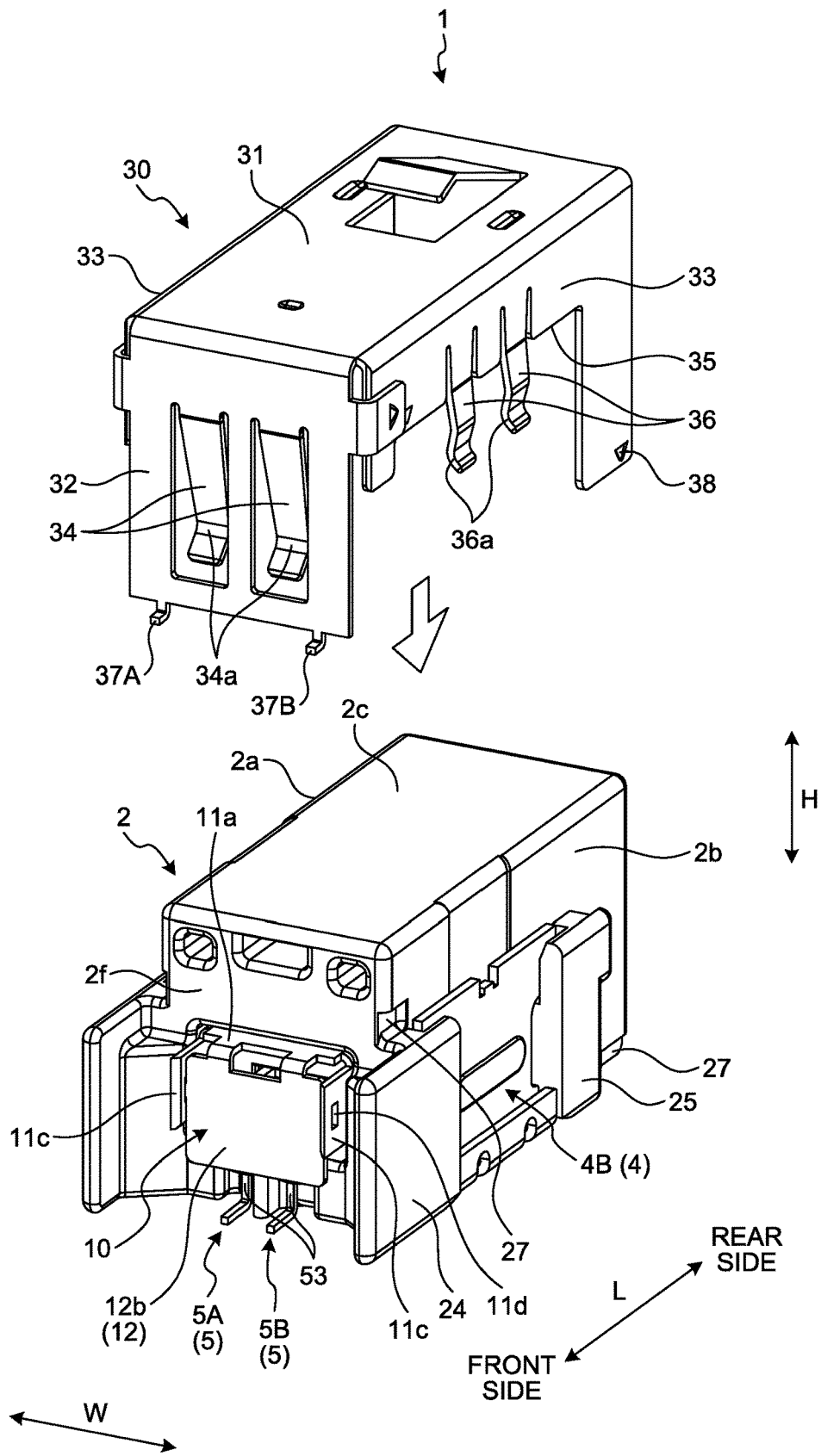
FIG. 15 is a perspective view for explaining assembling of an outer shield according to the embodiment.

FIG. 10 is a perspective view illustrating a connection configuration in the inside of the substrate connector according to the embodiment, FIG. 11 is another perspective view illustrating the connection configuration in the inside of the substrate connector according to the embodiment, FIG. 12 is a perspective view for explaining assembling of the shield shell according to the embodiment, FIG. 13 is a sectional view of the substrate connector according to the embodiment, FIG. 14 is another sectional view of the substrate connector according to the embodiment, and FIG. 15 is a perspective view for explaining assembling of an outer shield according to the embodiment. In FIG. 13 and FIG. 14, sectional views at the sectional position XIII-XIII in FIG. 12 are illustrated.

Figure 2:
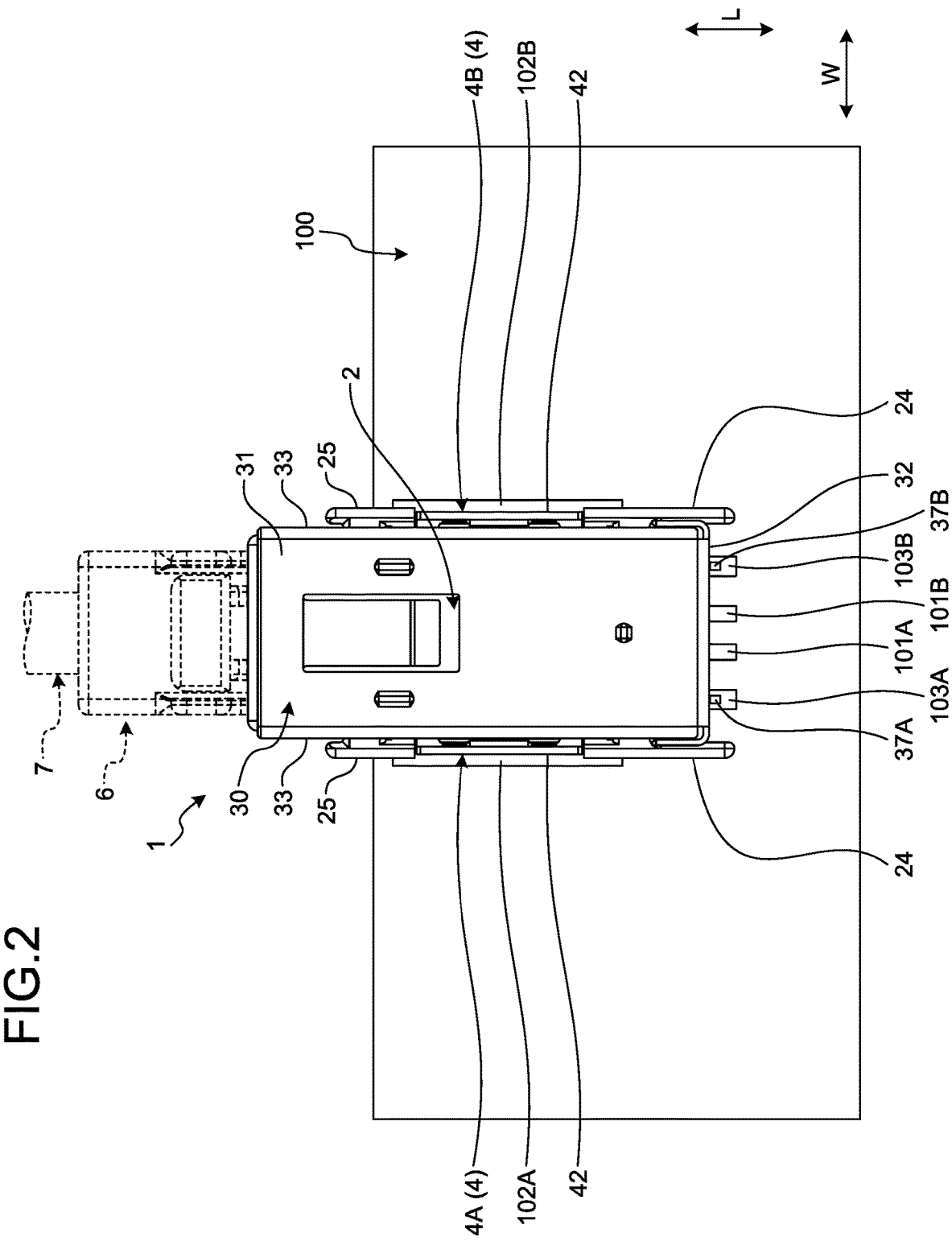
FIG. 2 is a plan view of the substrate connector according to the embodiment.
Figure 3:
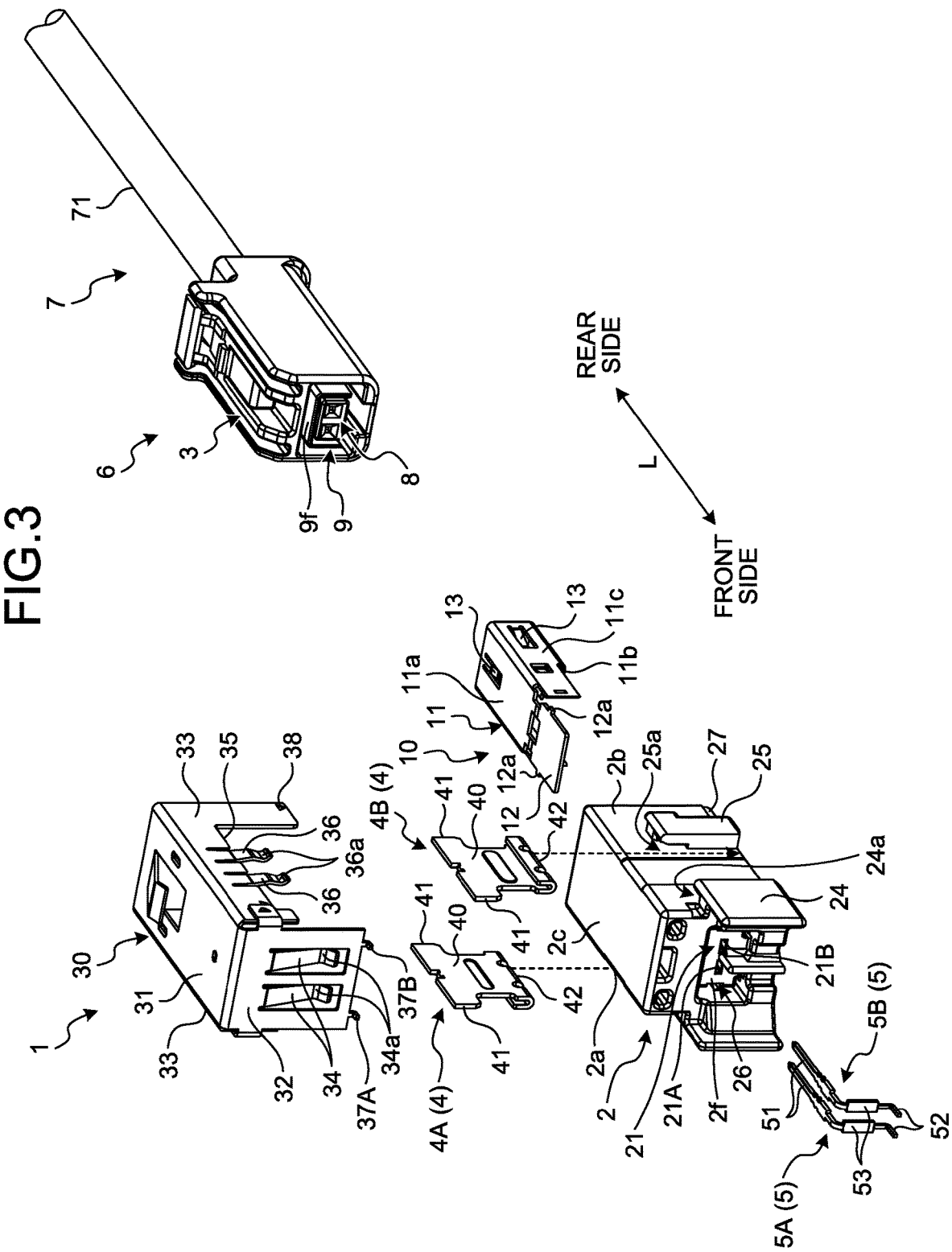
FIG. 3 is an exploded perspective view of the substrate connector according to the embodiment.

As illustrated in FIG. 1 to FIG. 3, a substrate connector 1 in the present embodiment includes a housing 2, pegs 4, terminals 5, a shield shell 10, and an outer shield 30. The substrate connector 1 of the present embodiment connects a communication cable 7, and a circuit that is arranged on a substrate 100. The communication cable 7 is a cable for differential transmission, and is an Ethernet (registered trademark) cable, for example. The communication cable 7 includes a first communication line 72A and a second communication line 72B that are inserted to a sheath 71 (for example, see FIG. 7).

In the description of the substrate connector 1, an axial direction of the substrate connector 1 is referred to as "first direction L". A width direction of the substrate connector 1 is referred to as "second direction W". The second direction W is a direction in which a first terminal 5A and a second terminal 5B which will be described later are arrayed. A height direction of the substrate connector 1 is referred to as "third direction H". The third direction H is a direction orthogonal to both the first direction L and the second direction W. The substrate connector 1 is fixed onto the substrate 100 such that one surface (bottom surface) in the third direction H faces the substrate 100. The side to which the terminals 5 are connected when viewed from the housing 2 is referred to as "front side" in the first direction L, and the opposite side of the front side is referred to as "rear side". At an end portion of the communication cable 7, a cable connector 6 is connected. The cable connector 6 is connected to the substrate connector 1 from the rear side.

The substrate 100 is a printed-circuit board, for example. The substrate 100 includes circuits formed on the surface thereof and the inside. Furthermore, the substrate 100 of the present embodiment includes a communication circuit. The communication circuit may be formed directly on the substrate 100 or may be mounted on the substrate 100 as an IC (integrated circuit) and the like having a communication function. As illustrated in FIG. 1 and FIG. 2, the substrate 100 includes a first conductor 101A, a second conductor 101B, pads 102A and 102B, and grounding conductors 103A and 103B.

The first conductor 101A and the second conductor 101B are arranged contiguously along the second direction W. The grounding conductors 103A and 103B are arranged sandwiching the first conductor 101A and the second conductor 101B between them in the second direction W. Along the second direction W, the grounding conductor 103A, the first conductor 101A, the second conductor 101B, and the grounding conductor 103B are in line in that order. The pads 102A and 102B are arranged being displaced from the first conductor 101A, the second conductor 101B, and the grounding conductors 103A and 103B along the first direction L. The first conductor 101A and the second conductor 101B are each connected to the communication circuit of the substrate 100. The communication circuit controls the communication performed via the communication cable 7.

The housing 2 is a housing of the substrate connector 1. The housing 2 is formed of insulative synthetic resin and the like in a substantially rectangular parallelepiped shape. As illustrated in FIG. 4 and FIG. 5, the housing 2 includes a main body 20, a terminal-retaining portion 21, and a shell-retaining portion 26. The main body 20 is an outer wall portion of the housing 2, and constitutes an outer shell of the housing 2. The main body 20 of the present embodiment is formed in an angular cylindrical shape. The main body 20 is fixed onto the substrate 100 by the pegs 4.

The terminal-retaining portion 21 is arranged in the inside of the main body 20 and is integrally formed with the main body 20. The shape of the terminal-retaining portion 21 of the present embodiment is a rectangular parallelepiped shape or an angular cylindrical shape. The terminal-retaining portion 21 is located on the front side in an inner space of the main body 20. In the inner space of the main body 20, a portion of the rear side relative to the terminal-retaining portion 21 is an accommodation space 28 to which the cable connector 6 is inserted. The cable connector 6 is inserted to the accommodation space 28 from an opening 20a of the back end of the main body 20 along the first direction L.

As illustrated in FIG. 4 and FIG. 5, the shell-retaining portion 26 of the present embodiment is formed between the main body 20 and the terminal-retaining portion 21. In other words, the shell-retaining portion 26 is formed surrounding the terminal-retaining portion 21. The shell-retaining portion 26 is in a slit-like shape and separates the main body 20 and the terminal-retaining portion 21. The shell-retaining portion 26 of the present embodiment is in an angular cylindrical shape and extends along the first direction L.

The shell-retaining portion 26 includes a first slit portion 26a, a second slit portion 26b, a third slit portion 26c, a fourth slit portion 26d, and a stopper portion 26e. The first slit portion 26a, the second slit portion 26b, the third slit portion 26c, and the fourth slit portion 26d surround the terminal-retaining portion 21, while communicating with one another, and form a void portion of an angular cylindrical shape as a whole. That is, the cross-sectional shape of the shell-retaining portion 26 is a substantially rectangular frame shape.

The first slit portion 26a and the second slit portion 26b are formed between the main body 20 and the terminal-retaining portion 21 in the third direction H. The first slit portion 26a is a gap between a top surface 21u of the terminal-retaining portion 21 and the main body 20. The top surface 21u, in the terminal-retaining portion 21, is a surface that faces the opposite side to the substrate 100 side. The second slit portion 26b is a gap between a bottom surface 21d of the terminal-retaining portion 21 and the main body 20. The bottom surface 21d, in the terminal-retaining portion 21, is a surface that faces the substrate 100 side. The first slit portion 26a makes, along the first direction L, a space of the front side relative to the terminal-retaining portion 21 communicate with the accommodation space 28. In other words, the first slit portion 26a runs through the housing 2 along the first direction L.

The third slit portion 26c and the fourth slit portion 26d are formed between the main body 20 and the terminal-retaining portion 21 in the second direction W. The third slit portion 26c is a gap between one lateral surface 21c in the terminal-retaining portion 21 and the main body 20. The fourth slit portion 26d is a gap between another lateral surface 21d in the terminal-retaining portion 21 and the main body 20. The third slit portion 26c makes, along the first direction L, a space of the front side relative to the terminal-retaining portion 21 communicate with the accommodation space 28. That is, the third slit portion 26c and the fourth slit portion 26d run through the housing 2 along the first direction L.

The stopper portion 26e connects the main body 20 and the terminal-retaining portion 21. The stopper portion 26e is arranged at the front end of the second slit portion 26b. That is, the stopper portion 26e is a portion connecting the bottom surface 21d of the terminal-retaining portion 21 and an inner side surface of the main body 20. The stopper portion 26e latches the shield shell 10 and positions the shield shell 10 when the shield shell 10 is inserted to the shell-retaining portion 26.

The first slit portion 26a, the second slit portion 26b, the third slit portion 26c, and the fourth slit portion 26d are opened toward the accommodation space 28. That is, the shell-retaining portion 26 is opened toward the accommodation space 28 along the first direction L. The first direction L is an insertion direction in which the cable connector 6 is inserted.

In the terminal-retaining portion 21, a first hole 21A and a second hole 21B are formed. The first hole 21A and the second hole 21B run through the terminal-retaining portion 21 along the first direction L. That is, the first hole 21A and the second hole 21B make a space of the front side relative to the terminal-retaining portion 21 communicate with the accommodation space 28. The first hole 21A and the second hole 21B are arranged side by side along the second direction W.

As illustrated in FIG. 3, the terminals 5 include the first terminal 5A and the second terminal 5B. The first terminal 5A and the second terminal 5B include a first connecting portion 51, a second connecting portion 52, and an intermediate portion 53. The first connecting portion 51, the second connecting portion 52, and the intermediate portion 53 are integrally formed of conductive metal such as copper. The terminal 5 is bent, after formed in a flat plate-like shape, and made into a bent shape illustrated in FIG. 3. The first connecting portion 51 is one end portion of the terminal 5, and the second connecting portion 52 is the other end portion of the terminal 5. The intermediate portion 53 is a portion between the first connecting portion 51 and the second connecting portion 52. The first connecting portion 51 and the second connecting portion 52 are bent so as to be orthogonal to the intermediate portion 53. The first connecting portion 51 and the second connecting portion 52 are bent toward the directions opposite to each other with respect to the intermediate portion 53.

The first connecting portion 51 of the first terminal 5A is inserted to the first hole 21A of the housing 2. The first connecting portion 51 of the second terminal 5B is inserted to the second hole 21B of the housing 2. As illustrated in FIG. 1 and FIG. 2, the second connecting portion 52 of the first terminal 5A is connected to the first conductor 101A of the substrate 100. The second connecting portion 52 of the second terminal 5B is connected to the second conductor 101B. The second connecting portions 52 are fixed onto the conductors 101A and 101B by solder, for example.

The shield shell 10 is inserted from the rear side with respect to the housing 2, and is retained by the housing 2. The shield shell 10 is formed of metal having conductivity, for example. The shield shell 10 is, after formed in a flat plate-like shape, made into a tubular shape by folding. As for the shape of the shield shell 10 of the present embodiment, the cross-sectional shape is a rectangular tubular shape.

As illustrated in FIG. 3 and FIG. 6, the shield shell 10 includes a tubular main body 11 and a front wall 12. The main body 11 includes a top wall 11a, a bottom wall 11b, and a pair of lateral walls 11c. The top wall 11a and the bottom wall 11b face each other in the third direction H. The pair of lateral walls 11c face each other in the second direction W. In a state before being assembled to the housing 2, the top wall 11a and the front wall 12 form a flat plate that is continuous along the first direction L. That is, the front wall 12 extends toward the first direction L from the front end of the top wall 11a. On the lateral surfaces in the second direction W of the front wall 12, protrusions 12a are formed. The protrusions 12a are arranged on the lateral surface on both sides in the front wall 12. In each lateral wall 11c, a through hole 11d corresponding to the protrusion 12a is formed. The through hole 11d is arranged at a front end portion of the lateral wall 11c.

In the shield shell 10 of the present embodiment, relative to the top wall 11a and the lateral walls 11c, the bottom wall lib is short. The lateral walls 11c project toward the front side relative to the top wall 11a and the bottom wall lib. A front end 11e of the bottom wall lib is located on the rear side relative to a front end 11f of the top wall 11a.

As illustrated in FIG. 3, the main body 11 of the shield shell 10 includes spring portions 13. The spring portion 13 is a plate spring that is curved toward an inner space of the main body 11. The spring portions 13 are provided on the top wall 11a and the lateral walls 11c. The spring portions 13 make electrical contact with a shield member 9 of the cable connector 6. When the cable connector 6 is inserted to the substrate connector 1, the spring portions 13 come in contact with a front-side portion 9f of the shield member 9. The shield shell 10 is electrically connected to the shield member 9 via the spring portions 13.

The peg 4 is formed of metal having conductivity. As illustrated in FIG. 2 and FIG. 3, the substrate connector 1 of the present embodiment includes, as the pegs 4, a first peg 4A and a second peg 4B. The shape of the peg 4 of the present embodiment is substantially rectangular. As illustrated in FIG. 3, the peg 4 includes a main body 40, press fitting portions 41, and a connecting portion 42. The main body 40, the press fitting portions 41, and the connecting portion 42 are integrally formed.

The main body 40 is a rectangular flat plate-like constituent portion. The connecting portion 42 is a portion formed at one end of the main body 40, and is fixed onto the pad 102A or 102B. The connecting portion 42 is folded back such that the cross-sectional shape is substantially U-shaped. The connecting portion 42 of the first peg 4A is fixed onto one pad 102A by solder and the like. The connecting portion 42 of the second peg 4B is fixed onto the other pad 102B by solder and the like. The press fitting portions 41 and 41 are arranged at the end portion on the opposite side of the connecting portion 42 in the main body 40. The press fitting portions 41 and 41 project on both sides along the extending direction of the connecting portion 42. That is, a pair of press fitting portions 41 and 41 project toward the opposite directions to each other along the first direction L from the main body 40.

The outer shield 30 is formed of metal having conductivity, for example. As illustrated in FIG. 3, the outer shield 30 includes a top wall 31, a front wall 32, and a pair of lateral walls 33 and 33. The top wall 31, the front wall 32, and the lateral walls 33 and 33 are integrally formed. The top wall 31 is a wall portion covering a top surface 2c of the housing 2. The front wall 32 is a wall portion covering a front surface 2f of the housing 2. The lateral walls 33 and 33 are wall portions covering lateral surfaces 2a and 2b of the housing 2.

The front wall 32 and the lateral walls 33 and 33 are folded so as to be substantially orthogonal to the top wall 31. The lateral walls 33 and 33 face each other in the second direction W. The front wall 32 is substantially orthogonal to the lateral walls 33 and 33. In the front wall 32, a pair of spring portions 34 are formed. The pair of spring portions 34 are arranged side by side along the second direction W. The spring portion 34 includes a contact portion 34a that makes contact with the front wall 12 of the shield shell 10. The spring portion 34 is a plate spring that is formed in a cantilever form, and is slightly slanted toward the rear side. The contact portion 34a is curved toward the rear side. At the distal end of the front wall 32, a pair of leg portions 37A and 37B are formed. The pair of leg portions 37A and 37B are arranged side by side along the second direction W. The leg portions 37A and 37B project toward the front side from the front wall 32.

In the lateral walls 33 and 33, a cutout portion 35 is formed at the location corresponding to the peg 4 and to retaining portions 24 and 25. The shape of the cutout portion 35 is rectangular, for example. In the lateral walls 33 and 33, a pair of spring portions 36 are formed. The pair of spring portions 36 are arranged side by side along the first direction L. The spring portion 36 includes a contact portion 36a that makes contact with the peg 4. The spring portion 36 is a plate spring that is formed in a cantilever form, and projects from the cutout portion 35 toward the direction away from the top wall 31. The contact portion 36a is curved toward the inner side of the outer shield 30.

In the lateral surfaces 2a and 2b of the housing 2, a recessed portion 27 is formed. The lateral walls 33 and 33 of the outer shield 30 include a projecting portion 38 that engages with the recessed portion 27. The outer shield 30 is assembled to the housing 2 while moving relatively along the third direction H with respect to the housing 2. As the projecting portion 38 of the outer shield 30 engages with the recessed portion 27 of the housing 2, the attachment of the outer shield 30 to the housing 2 is completed. When the outer shield 30 is attached to the housing 2, the outer shield 30 is electrically connected to the shield shell 10 via the spring portions 34. Furthermore, the outer shield 30 is electrically connected to the pegs 4 via the spring portions 36.

As illustrated in FIG. 3, at one end of the communication cable 7, the cable connector 6 is attached. The cable connector 6, as will be described later, is a female connector that includes female terminals 82A and 82B in the inside (see FIG. 8). As illustrated in FIG. 7, the cable connector 6 includes an outer housing 3, an inner housing 8, and the shield member 9. The outer housing 3 and the inner housing 8 are formed of insulative synthetic resin and the like. The inner housing 8 is formed such that the cross-sectional shape is a substantially rectangular tubular shape. In the front surface of the inner housing 8, a first hole 85A and a second hole 85B are formed. The first hole 85A and the second hole 85B make the external space communicate with the internal space of the inner housing 8.

As illustrated in FIG. 8, in the inner housing 8, the first female terminal 82A and the second female terminal 82B are inserted. The first female terminal 82A and the second female terminal 82B of the present embodiment are female terminals having an identical shape. The female terminals 82A and 82B are formed of conductive metal such as copper.

The first female terminal 82A is connected to the first communication line 72A and the second female terminal 82B is connected to the second communication line 72B. The female terminals 82A and 82B include a connecting portion 83 and a swaged portion 84. The connecting portion 83 is formed in an angular cylindrical shape, and receives the terminal 5. The swaged portion 84 is swaged to the sheath and core wires of the communication line 72A or 72B. The female terminals 82A and 82B are electrically connected to the core wires of the communication lines 72A and 72B at the swaged portions 84. The first connecting portion 51 of the terminal 5 is inserted to the connecting portion 83 and is electrically connected to the connecting portion 83 (see FIG. 11).

As illustrated in FIG. 7, the shield member 9 includes a main body 90 and a cover 93. The main body 90 and the cover 93 are formed of conductive metal, for example. The main body 90 includes a swaged portion 91 and a retaining portion 92. The retaining portion 92 is integrally formed with the swaged portion 91. The retaining portion 92 is formed in an angular semi-cylindrical shape and engages with the inner housing 8. The swaged portion 91 connects to the back end of the retaining portion 92. The cover 93 is formed in an angular semi-cylindrical shape.

The cover 93 is combined with the retaining portion 92 and forms an angular cylindrical shield portion. At the back end of the cover 93, a semi-cylindrical portion 93a is formed. The semi-cylindrical portion 93a is swaged to the distal end of the sheath 71 together with the swaged portion 91. Between the swaged portion 91 and the sheath 71, a braid 73 of the communication cable 7 is clamped. The braid 73 is a cylindrical conductor for which a plurality of braided wires are braided in a crossed manner, and covers the first communication line 72A and the second communication line 72B. The braid 73 is folded back at the distal end portion to the outside and covers the sheath 71. The shield member 9 is electrically connected to the braid 73 at the swaged portion 91. Between the braid 73 and the sheath 71, a ring-shaped sleeve is arranged. The swaged portion 91 is swaged so as to clamp the braid 73 between the sleeve and the swaged portion 91.

The outer housing 3 is formed in a tubular shape and is open on both ends. The shape of the outer housing 3 of the present embodiment is a shape for which the cross-sectional shape is a rectangular tubular shape. The outer housing 3 includes a lock arm 3b. The lock arm 3b is a cantilever-like arm portion for which the back end is a free end. In the lock arm 3b, an engaging claw 3a that engages with the housing 2 is formed. At the back end of the lock arm 3b, an operating portion 3c is provided. An operator can, by pressing down the operating portion 3c, release the engagement of the lock arm 3b and the housing 2. The shield member 9 is inserted from the rear side with respect to the outer housing 3, and engages with the outer housing 3.

The cable connector 6 is connected to the substrate connector 1 from the rear side. The shield member 9 of the cable connector 6 connects to the shield shell 10 in the inside of the substrate connector 1. In FIG. 9, a connection state of the shield shell 10 and the shield member 9 is illustrated. The front side portion of the shield member 9 is fitted in the main body 11 of the shield shell 10. The shield shell 10 covers the first terminal 5A and the second terminal 5B. The terminals 5 are covered from the front side with the front wall 12 of the shield shell 10. Furthermore, the terminals 5 are covered from both sides in the second direction W with the lateral walls 11c of the shield shell 10. The terminals 5 are further covered from the opposite side of the substrate 100 with the top wall 11a of the shield shell 10. The shield member 9 constitutes a tubular shield unit together with the shield shell 10. This shield unit covers an electrical connecting portion of the terminals 5 and the communication cable 7.

In FIG. 10, a connection state of the terminals 5 and the cable connector 6 is illustrated. The first connecting portions 51 of the terminals 5 are inserted to the first hole 85A and the second hole 85B of the inner housing 8. The terminals 5 are, in the inside of the inner housing 8, electrically connected to the first female terminal 82A and the second female terminal 82B as illustrated in FIG. 11.

With reference to FIG. 3 and FIG. 12 to FIG. 15, an order of assembling the substrate connector 1 will be described. With reference to FIG. 3, first, the pegs 4 are assembled to the housing 2. The first peg 4A and the second peg 4B are attached to the housing 2 along the third direction H. The first peg 4A is attached to one lateral surface 2a of the housing 2, and the second peg 4B is attached to the other lateral surface 2b of the housing 2.

In the present embodiment, the press fitting portions 41 of the pegs 4 are press fitted to the housing 2. In the lateral surfaces 2a and 2b of the housing 2, the retaining portions 24 and 25 that retain the press fitting portions 41 are each formed. The retaining portions 24 and 25 are arranged leaving, in the first direction L, a gap for which the connecting portion 42 can pass through. The retaining portions 24 and 25 include grooves 24a and 25a, respectively. The groove 24a of the retaining portion 24 and the groove 25a of the retaining portion 25 face each other in the first direction L. The press fitting portions 41 and 41 of the pegs 4 are press fitted into the grooves 24a and 25a while sliding along the third direction H.

When the pegs 4A and 4B are attached to the housing 2, the terminals 5 are assembled to the housing 2 next. The terminals 5 are assembled to the housing 2 in a position in which the intermediate portion 53 extends along the third direction H. At this time, the first connecting portion 51 extends toward the rear side from the intermediate portion 53 along the first direction L. The second connecting portion 52 extends toward the front side from the intermediate portion 53 along the first direction L. The first connecting portions 51 are inserted to the holes 21A and 21B that are formed in the terminal-retaining portion 21 of the housing 2. The two holes 21A and 21B are arranged side by side along the second direction W. The first connecting portion 51 of the first terminal 5A is press fitted in the first hole 21A and is retained by the first hole 21A. The first connecting portion 51 of the second terminal 5B is press fitted in the second hole 21B and is retained by the second hole 21B.

When the terminals 5 are attached to the housing 2, the shield shell 10 is assembled to the housing 2 as illustrated in FIG. 12. The shield shell 10 is inserted to the housing 2 with the front wall 12 taking the lead. The shield shell 10 is inserted to the housing 2 from the opening 20a (see FIG. 5) and is inserted to the shell-retaining portion 26. More specifically, as illustrated in FIG. 13, the front wall 12 and the top wall 11a of the shield shell 10 are inserted to the first slit portion 26a of the shell-retaining portion 26. The bottom wall 11b is inserted to the second slit portion 26b. The lateral walls 11c and 11c are each inserted to the third slit portion 26c and the fourth slit portion 26d (see FIG. 4).

As illustrated in FIG. 13, the shield shell 10 is inserted to the shell-retaining portion 26 up to the position where the bottom wall 11b abuts the stopper portion 26e. The stopper portion 26e latches the bottom wall 11b and positions the shield shell 10 in the first direction L. The housing 2 of the present embodiment, as illustrated in FIG. 4 and others, includes a plurality of projecting portions 20b. The projecting portions 20b project toward the shell-retaining portion 26 from the main body 20 and extend along the first direction L. As illustrated in FIG. 13, the projecting portions 20b come in contact with the shield shell 10 and retain the shield shell 10, and position the shield shell 10 in the second direction W and in the third direction H.

In a state where the shield shell 10 is positioned by the stopper portion 26e, the front wall 12 of the shield shell 10 and a part of the main body 11 project to the outside of the housing 2 from the shell-retaining portion 26. In more detail, the front wall 12 and a part of the top wall 11a project toward the front side from the first slit portion 26a. The front end portions of the lateral walls 11c project toward the front side from the third slit portion 26c and from the fourth slit portion 26d.

The front wall 12 projecting from the first slit portion 26a is bent with respect to the top wall 11a as indicated by an arrow Y1 in FIG. 13. The front wall 12 of the present embodiment, as illustrated in FIG. 12 and FIG. 13, includes a main body 12b and a pair of hinge portions 12c. The main body 12b is a covering portion that covers the terminals 5 and is formed in a rectangular shape. The hinge portions 12c are plate-like constituent portions that connect the main body 12b and the top wall 11a. The pair of hinge portions 12c are juxtaposed along the second direction W. The front wall 12 is bent at the hinge portions 12c.

In the present embodiment, the hinge portions 12c, as illustrated in FIG. 14, are bent such that the main body 12b and the top wall 11a are orthogonal. As the hinge portions 12c are bent, the main body 12b faces the terminals 5 in the first direction L, and covers the terminals 5 from the front side (see FIG. 15). The protrusions 12a of the front wall 12 engage with the through holes 11d of the lateral walls 11c.

As illustrated in FIG. 15, the main body 12b of the front wall 12 forms a wall surrounding the terminals 5 together with the pair of lateral walls 11c. The main body 12b of the front wall 12 faces the intermediate portions 53 of the terminals 5 in the first direction L, and covers the intermediate portions 53 from the front side. The lateral walls 11c face the intermediate portions 53 in the second direction W, and cover the intermediate portions 53 from the lateral sides. As the portions of the terminals 5 exposed to the outside of the housing 2 are surrounded by the main body 12b of the front wall 12 and the lateral walls 11c, the shielding properties of the substrate connector 1 is improved.

When the shield shell 10 is attached to the housing 2, the outer shield 30 is assembled to the housing 2 as illustrated in FIG. 15. As illustrated in FIG. 1, the lateral walls 33 of the outer shield 30 cover the housing 2 while exposing the pegs 4 and the retaining portions 24 and 25. As a result, by reducing the distance between the lateral wall 33 and the lateral surface 2a of the housing 2 and between the lateral wall 33 and the lateral surface 2b of the housing 2, the shielding properties of the outer shield 30 can be improved. In the housing 2, the area corresponding to the cutout portion 35 of the lateral wall 33 is shielded by the peg 4. Thus, by the outer shield 30 and the pegs 4, substantially a whole area of the lateral surface of the housing 2 is shielded.

When the outer shield 30 is attached to the housing 2, the substrate connector 1 is completed. The substrate connector 1 is mounted on the substrate 100. The substrate connector 1, as illustrated in FIG. 1, is placed on the substrate 100 such that the second connecting portion 52 of the first terminal 5A faces the first conductor 101A of the substrate 100, and such that the second connecting portion 52 of the second terminal 5B faces the second conductor 101B. The substrate connector 1 is further placed such that the first peg 4A and the second peg 4B face the respective pads 102A and 102B of the substrate 100, and such that the leg portions 37A and 37B of the outer shield 30 face the respective grounding conductors 103A and 103B.

The second connecting portions 52 of the first terminal 5A and the second terminal 5B are connected to the respective first conductor 101A and the second conductor 101B physically and electrically. The leg portions 37A and 37B of the outer shield 30 are connected to the grounding conductors 103A and 103B physically and electrically. The connecting portions 42 of the first peg 4A and the second peg 4B are physically connected to the pads 102A and 102B and fixed onto the pads 102A and 102B.

In the housing 2 of the present embodiment, the main body 20 and the terminal-retaining portion 21 are integrally combined. The main body 20 is an outer shell of the housing 2, and is a fitting portion for which the cable connector 6 is fitted in. The terminal-retaining portion 21 is a retaining body that retains the terminals 5, and is a dielectric body arranged between the terminals 5 and the shield shell 10. As the main body 20 and the terminal-retaining portion 21 are integrally formed, the reduction in the number of components in the substrate connector 1 is achieved.

Furthermore, the housing 2 of the present embodiment can cope with both a case where the shield function is needed and a case where the shield function is not needed. In the case where the shield function is needed, the shield shell 10 and the outer shield 30 are attached to the housing 2. Meanwhile, in the case where the shield function is not needed, the shield shell 10 and the outer shield 30 are omitted in the substrate connector 1. Thus, the substrate connector 1 of the present embodiment can use the same housing 2 regardless of difference in specifications (necessity of shield function), and can standardize the components.

In the housing 2 of the present embodiment, by the stopper portion 26e, the main body 20 and the terminal-retaining portion 21 are connected. By making a connecting portion that connects the main body 20 and the terminal-retaining portion 21 function as the stopper portion 26e, simplification of the configuration is achieved.

Furthermore, as the first slit portion 26a, the third slit portion 26c, and the fourth slit portion 26d run through the housing 2 along the first direction L, a shield wall that surrounds the terminals 5 can be formed. In the present embodiment, when assembling the shield shell 10 to the housing 2, the front wall 12 and the top wall 11a are inserted to the first slit portion 26a, and the pair of lateral walls 11c and 11c are inserted to the third slit portion 26c and to the fourth slit portion 26d. Thereafter, the front wall 12 is bent, and the shield wall that surrounds the terminals 5 is formed by the front wall 12 and the pair of lateral walls 11c. That is, by inserting the three walls 11a, 11c, and 11c of the shield shell 10 to the three slit portions 26a, 26c, and 26d running through the housing 2, the shield wall that surrounds the terminals 5 from the front side, the lateral sides, and the upper side is formed.

Moreover, in the housing 2 of the present embodiment, the stopper portion 26e is arranged at the fourth slit portion 26d. The stopper portion 26e connects the terminal-retaining portion 21 and the main body 20. Thus, in the substrate connector 1 of the present embodiment, it is possible to assemble the tubular shield shell 10 to the housing 2 while achieving an integral structure in which the main body 20 and the terminal-retaining portion 21 are integrally combined.

As in the foregoing, the substrate connector 1 of the present embodiment includes the housing 2 as a housing, the first terminal 5A, and the second terminal 5B. The substrate connector 1 may further include the shield shell 10. The housing 2 is an insulative member that is fixed onto the substrate 100. The first terminal 5A is electrically connected to the first communication line 72A of the communication cable 7 in the inside of the housing 2 and is electrically connected to the circuit of the substrate 100 on the outside of the housing 2. The second terminal 5B is electrically connected to the second communication line 72B of the communication cable 7 in the inside of the housing 2 and is electrically connected to the circuit of the substrate 100 on the outside of the housing 2.

The housing 2 includes the main body 20, the terminal-retaining portion 21, and the shell-retaining portion 26. The main body 20 is an outer wall of the housing 2, and is fixed onto the substrate 100. The terminal-retaining portion 21 is arranged in the inside of the main body 20 and is integrally formed with the main body 20. The terminal-retaining portion 21 retains the first terminal 5A and the second terminal 5B. The shell-retaining portion 26 includes the slit portions formed between the main body 20 and the terminal-retaining portion 21. In the shell-retaining portion 26, the shield shell 10 that surrounds the first terminal 5A and the second terminal 5B is inserted.

In the housing 2 of the present embodiment, the terminal-retaining portion 21 and the main body 20 are integrally formed while having a shell-retaining portion to which the shield shell 10 is inserted. Thus, the substrate connector 1 of the present embodiment makes it possible to reduce the number of components.

The substrate connector 1 of the present embodiment further includes the conductive outer shield 30. The outer shield 30 covers the housing 2, and is grounded by being fixed onto the substrate 100. The outer shield 30 includes the spring portions 34 that come in contact with the shield shell 10. The substrate connector 1 of the present embodiment can improve the shield properties by the outer shield 30. Furthermore, via the outer shield 30, the shield shell 10 can be grounded.

The housing 2 of the present embodiment has the accommodation space 28 to which the cable connector 6 is inserted. The shell-retaining portion 26 is opened toward the accommodation space 28 along the insertion direction of the cable connector 6. Thus, in the substrate connector 1 of the present embodiment, the shield shell 10 can be inserted to the shell-retaining portion 26 from the accommodation space 28 side. That is, the accommodation space 28 functions as a path of the shield shell 10 when the shield shell 10 is assembled to the housing 2, and functions as a fitting portion for which the cable connector 6 is fitted in when the cable connector 6 is connected.

In the substrate connector 1 of the present embodiment, the cross-sectional shape of the shell-retaining portion 26 at the cross section orthogonal to the insertion direction of the shield shell 10 is a frame shape surrounding the terminal-retaining portion 21. The shield shell 10 is inserted to the shell-retaining portion 26 to surround the terminal-retaining portion 21. Thus, in the substrate connector 1 of the present embodiment, the first terminal 5A and the second terminal 5B can be surrounded extending over a whole circumference by the shield shell 10.

The shell-retaining portion 26 of the present embodiment includes the stopper portion 26e that connects the terminal-retaining portion 21 and the main body 20. The shield shell 10 is latched and positioned by the stopper portion 26e. The stopper portion 26e has a function as a connecting portion that connects the terminal-retaining portion 21 and the main body 20 and a function of positioning the shield shell 10. Thus, both an integral structure of the terminal-retaining portion 21 and the main body 20, and simplification of the housing 2 can be satisfied.

Modifications of Embodiment

Modifications of the embodiment will be described. The shapes and arrangements of various portions of the housing 2 are not limited to the exemplified shapes and arrangements. For example, the cross-sectional shape of the terminal-retaining portion 21 is not limited to a rectangular shape. The cross-sectional shape of the terminal-retaining portion 21 may be a polygon other than a rectangle, a circle, and the like. The cross-sectional shape of the shell-retaining portion 26 is determined appropriately corresponding to the shape of the terminal-retaining portion 21. That is, the cross-sectional shape of the shell-retaining portion 26 only needs to be a frame shape surrounding the terminal-retaining portion 21, and is not limited to a rectangle.

The disclosed content in the above-described embodiment and the modifications can be implemented in combination as appropriate.

The substrate connector according to the present embodiment includes an insulative housing configured to be fixed to a substrate, a first terminal configured to be electrically connected to a first communication line of a communication cable in the inside of the housing and to be electrically connected to a circuit of the substrate on the outside of the housing, and a second terminal configured to be electrically connected to a second communication line of the communication cable in the inside of the housing and to be electrically connected to the circuit of the substrate on the outside of the housing.

The housing includes a main body that is an outer wall portion of the housing and is configured to be fixed onto the substrate, a terminal-retaining portion that is arranged in the inside of the main body, is integrally formed with the main body, and retains the first terminal and the second terminal, and a shell-retaining portion that includes a slit portion formed between the main body and the terminal-retaining portion and receives a shield shell inserted thereto to surround the first terminal and the second terminal. According to the substrate connector in the present embodiment, it has an effect in that at least one of reducing the number of components, or standardizing components can be achieved.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A substrate connector comprising:
    an insulative housing configured to be fixed onto a substrate;
    a first terminal configured to be electrically connected to a first communication line of a communication cable in an inside of the housing, and to be electrically connected to a circuit of the substrate on an outside of the housing; and
    a second terminal configured to be electrically connected to a second communication line of the communication cable in the inside of the housing, and to be electrically connected to the circuit of the substrate on the outside of the housing, wherein
    the housing includes
        a main body that is an outer wall portion of the housing and is configured to be fixed onto the substrate,
        a terminal-retaining portion that is arranged in an inside of the main body, is integrally formed with the main body, and retains the first terminal and the second terminal, and
        a shell-retaining portion that includes a slit portion formed between the main body and the terminal-retaining portion and receives a shield shell inserted thereto to surround the first terminal and the second terminal.

2. The substrate connector according to claim 1, further comprising:
    a conductive outer shield that covers the housing and is configured to be grounded by being fixed onto the substrate, wherein
    the outer shield includes a spring portion that comes in contact with the shield shell.

3. The substrate connector according to claim 1, wherein
    the housing has an accommodation space to which a counterpart connector is inserted, and
    the shell-retaining portion is opened toward the accommodation space along an insertion direction of the counterpart connector.

4. The substrate connector according to claim 2, wherein
    the housing has an accommodation space to which a counterpart connector is inserted, and
    the shell-retaining portion is opened toward the accommodation space along an insertion direction of the counterpart connector.

5. The substrate connector according to claim 1, wherein
    a cross-sectional shape of the shell-retaining portion at a cross section orthogonal to an insertion direction of the shield shell is a frame shape surrounding the terminal-retaining portion, and
    the shield shell is inserted to the shell-retaining portion to surround the terminal-retaining portion.

6. The substrate connector according to claim 2, wherein
    a cross-sectional shape of the shell-retaining portion at a cross section orthogonal to an insertion direction of the shield shell is a frame shape surrounding the terminal-retaining portion, and
    the shield shell is inserted to the shell-retaining portion to surround the terminal-retaining portion.

7. The substrate connector according to claim 3, wherein
    a cross-sectional shape of the shell-retaining portion at a cross section orthogonal to an insertion direction of the shield shell is a frame shape surrounding the terminal-retaining portion, and
    the shield shell is inserted to the shell-retaining portion to surround the terminal-retaining portion.

8. The substrate connector according to claim 4, wherein
    a cross-sectional shape of the shell-retaining portion at a cross section orthogonal to an insertion direction of the shield shell is a frame shape surrounding the terminal-retaining portion, and
    the shield shell is inserted to the shell-retaining portion to surround the terminal-retaining portion.

9. The substrate connector according to claim 1, wherein
    the shell-retaining portion includes a stopper portion configured to connect the terminal-retaining portion and the main body, and the shield shell is latched and positioned by the stopper portion.

10. The substrate connector according to claim 2, wherein
the shell-retaining portion includes a stopper portion configured to connect the terminal-retaining portion and the main body, and
the shield shell is latched and positioned by the stopper portion.

11. The substrate connector according to claim 3, wherein
the shell-retaining portion includes a stopper portion configured to connect the terminal-retaining portion and the main body, and
the shield shell is latched and positioned by the stopper portion.

12. The substrate connector according to claim 4, wherein
the shell-retaining portion includes a stopper portion configured to connect the terminal-retaining portion and the main body, and
the shield shell is latched and positioned by the stopper portion.

13. The substrate connector according to claim 5, wherein
the shell-retaining portion includes a stopper portion configured to connect the terminal-retaining portion and the main body, and
the shield shell is latched and positioned by the stopper portion.

14. The substrate connector according to claim 6, wherein
the shell-retaining portion includes a stopper portion configured to connect the terminal-retaining portion and the main body, and
the shield shell is latched and positioned by the stopper portion.

15. The substrate connector according to claim 7, wherein
the shell-retaining portion includes a stopper portion configured to connect the terminal-retaining portion and the main body, and
the shield shell is latched and positioned by the stopper portion.

16. The substrate connector according to claim 8, wherein
the shell-retaining portion includes a stopper portion configured to connect the terminal-retaining portion and the main body, and
the shield shell is latched and positioned by the stopper portion.

* * * * *